Jan. 14, 1958 J. KURSHAN 2,820,154

SEMICONDUCTOR DEVICES

Filed Nov. 15, 1954

INVENTOR.
Jerome Kurshan
BY J. C. Whittaker
ATTORNEY

United States Patent Office 2,820,154

Patented Jan. 14, 1958

2,820,154

SEMICONDUCTOR DEVICES

Jerome Kurshan, Princeton, N. J., assignor to Radio Corporation of America, a corporation of Delaware Application November 15, 1954, Serial No. 468,770

8 Claims. (Cl. 307—88.5)

This invention pertains to semiconductor devices and particularly to improved semiconductor devices for use at higher frequencies.

A typical transistor comprises emitter, collector and base electrodes in contact with a semiconductor body of a specific type of conductivity. In typical transistor operation, the charge carriers which flow through the semiconductor body proceed by a process of diffusion. By this process, the movement of the carriers is determined among other things by their innate mobilities and by their concentration gradient. The diffusion process is inherently a relatively slow process and limits the high frequency operation of semiconductor devices. If it is desired to overcome the limitations of the diffusion process by employing an electric field, generally additional electrodes are required and the structure of the transistor is complicated.

Accordingly, an important object of this invention is to provide a semiconductor device of new and improved form.

Another object of the invention is to provide an improved semiconductor device having a comparatively simple construction and providing improved operation at higher frequencies.

The principles and objects of this invention are accomplished by a typical embodiment thereof comprising a semiconductor device including a body of semiconductor material of substantially intrinsic conductivity having slots formed therein with projections of the body of the crystal extending between each slot. An input electrode which is to be employed as a current source electrode is formed of material of one type of conductivity on the projections, and an output or drain electrode, for receiving current from said source electrode, and of the same type of material, is formed on another portion of the crystal, preferably opposite the projections. The source and drain are inter-connected through a load circuit and a power source. Since the semiconductor body is of intrinsic material, an electric field is present across the entire body between the source and drain electrodes. A control electrode of opposite conductivity-type material is formed in the body of the semiconductor crystal at the bottom of each of the slots. The control electrode is connected to a signal source and is employed for controlling, by space charge effect, the current flow between the source and drain electrodes.

In another embodiment of the invention, a semiconductor crystal is provided with a first set of slots separating a first set of projections and a second set of slots separating a second set of projections, the first set of slots and projections, preferably but not necessarily, being disposed opposite to the second set of slots and projections. In addition, sets of slots may be aligned or one set of slots may be aligned with the other set of projections. Source and drain electrodes are formed on the sets of projections and separate auxiliary electrodes are formed in each of the sets of slots. One auxiliary electrode may be a control electrode of the type described above and the other may be employed in the nature of a screen electrode adjacent to the output electrode.

The invention is described in greater detail by reference to the drawing wherein.

Similar elements are designated by similar reference characters throughout the drawing.

Figure 1:
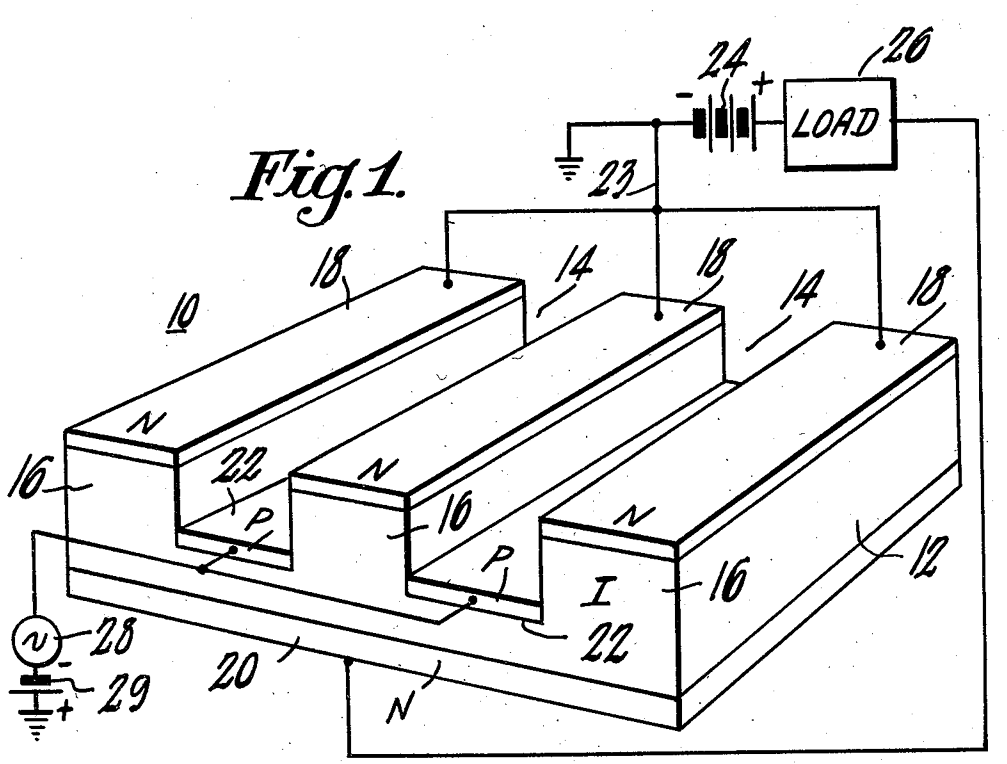
Fig. 1 is a perspective view of a first device embodying the principles of the invention and a circuit in which it may be operated.

Referring to Figure 1, a first embodiment of the invention comprises a device 10 including a semiconductor crystal or body 12 of substantially intrinsic germanium or silicon or the like. Intrinsic semiconductor material has substantially balanced concentrations of donor and acceptor impurity materials or a negligible excess of ionized impurities of one type compared to the carrier concentration. The crystal may be in the form of a plate or disk or the like.

The semiconductor crystal 12 is provided with a plurality of spaced slots 14 having projections 16 of the crystal, between them. An electrode, which may be termed the current source electrode of the device 10 comprises a layer 18 of, for example, N-type material formed on the top surface of each of the projections 16 of the crystal 12 between the slots 14. An output electrode termed the current drain electrode of the device comprises a layer 20 of N-type material covering all or a portion of the surface of the crystal 12 opposite the projections 16. A control electrode comprises a plurality of zones 22 of P-type material formed at the bottoms of the slots 14 between the projections 16 of the crystal 12. The source, drain, and control electrodes are in rectifying contact with the body 12.

The source, drain, and control electrodes may be prepared by an alloying or fusion process such as that described in an article by Law et al. entitled "A Developmental Germanium P–N–P Junction Transistor" in the November 1952 Proceedings of the IRE (page 1352).

Briefly, in the alloying process, quantities of suitable donor and acceptor impurity materials are alloyed with the crystal 12 to form the desired regions of N-type or P-type conductivity material, each separated from the semiconductor crystal by a rectifying barrier.

To form the P-type control grid in the body 12 any one of indium, gallium, aluminum, zinc or boron, for example, may be used as the impurity material. To form the N-type source and drain electrodes any one of phosphorous, arsenic, antimony or bismuth, for example, may be used.

In the circuit employed for operation of the device shown in Figure 1, the source electrode elements 18 are electrically interconnected to a lead 23 which is then connected to the negative terminal of a battery 24 the positive terminal of which is connected to a suitable load device 26 which is connected, in turn, to the drain electrode 20. The lead 23 is also connected to a source of reference potential such as ground. The elements 22 of its control electrode are connected through a signal source 28 to the negative terminal of a bias battery 29 the positive terminal of which is connected to ground.

In the operation of the device 10, the source electrode 18 injects a current of electrons into the crystal and this current flows to the drain electrode 20 under the influence of an electric field present in the crystal 12 between the source and drain electrodes 18 and 20, respectively. This electric field promotes the drift of current between the source and drain and thereby promotes the efficient operation of the device 10 at higher frequencies than those at which conventional triode transistors operate. The control electrode 22, by means of the bias voltage and the signal voltage applied thereto modifies the electric field between the source and the drain and thereby exerts control over the current flow therebetween and in the load 26.

Figure 2:
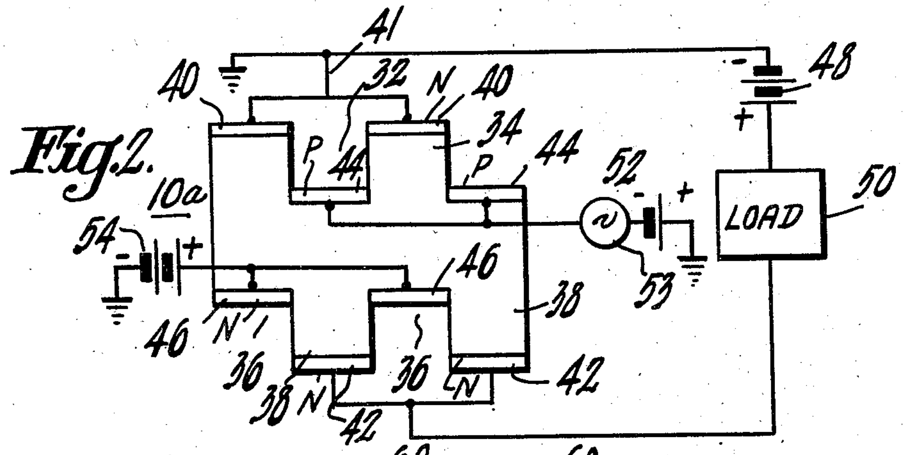
Fig. 2 is a sectional, elevational view of a second device embodying the principles of the invention and a circuit in which it may be operated; and, Fig. 3 is a sectional elevational view of a modification of the device of Fig. 2.

Referring to Figure 2 in another embodiment of the invention 10*a*, an intrinsic germanium crystal 30 is provided with a first set of slots 32 formed in one surface thereof and having a first set of projections 34 between them and a second set of slots 36 formed in the opposite surface with a second set of projections 38 between them but arranged so that each set of slots is aligned with the set of projections between the opposite set of slots. An N-type source electrode is made up of a plurality of N-type zones 40 on the projections 34 and the drain electrode is made up of a plurality of N-type zones 42 formed on the projections 38. A control electrode is made up of a plurality of P-type zones 44 formed in the bottom of the slots 32. Another electrode intended for operation as a screen electrode is made up of a plurality of N-type zones 46 formed in the opposite set of slots 36.

In the circuit of Figure 2, the source electrode N-type zones 40 are connected together to a lead 41 which is connected to the negative terminal of a battery 48 the positive terminal of which is connected to a load device 50 which is connected, in turn, to the layers 42 of the drain electrode. The P-type zones 44 of the control electrode are connected together and through a first signal source 52 to the negative terminal of a bias battery 53, the positive terminal of which is grounded. The N-type zones 46 of the screen electrode are connected to the positive terminal of a bias battery 54 the negative terminal of which is grounded. The operation of the device 10*a* is the same as that of the device 10 except that the screen electrode 46 provides the type of action afforded by a screen electrode in a vacuum tube. In particular, the screen electrode, as employed, reduces the capacitance between the control and drain electrodes and reduces the degenerative effect due to changes in drain voltage caused by current flowing in the load 50.

Figure 3:
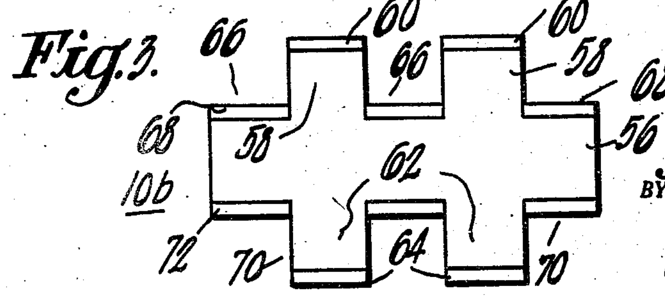

If desired, referring to Figure 3, the principles of the invention may be practiced in a device 10*b* having an intrinsic germanium body 56 and a first set of projections 58 carrying a source electrode 60 and aligned with a second set of projections 62 carrying a drain electrode 64. The body 56 is also provided with a first set of slots 66 having therein a control electrode 68 and a second set of slots 70 having therein a screen electrode 72.

If desired, the various illustrated conductivity types of the various electrodes may be reversed as is well known in the art. Of course, bias voltage polarities are also reversed as required.

What is claimed is:

1. A semiconductor device comprising a body of semiconductor material of substantially intrinsic conductivity, a set of projections formed in said body and having slots therebetween, a group of zones of semiconductor material of one type of conductivity on respective parts of said bodies near the tops of said projections, another zone of semiconductor material of said one type of conductivity on a part of said body opposite to said tops of said projections, and a group of separate zones of semiconductor material of opposite conductivity-type on respective parts of said body near the bottoms of said slots.

2. A semi-conductor device comprising a body of semiconductor material of substantially intrinsic conductivity, a set of projections formed in said body and having slots therebetween, a group of zones of semiconductor material of one type of conductivity in rectifying contact with respective parts of said body near the tops of said projections, another zone of semiconductor material of said one type of conductivity in rectifying contact with a part of said body opposite to said tops of said projections, and a group of zones of semiconductor material of opposite conductivity-type in rectifying contact with respective parts of said body near the bottoms of said slots.

3. A semiconductor device comprising a body of semiconductor material of substantially intrinsic conductivity, a set of projections formed in said body and having slots therebetween, a group of zones of semiconductor material of N-type conductivity on respective parts of said bodies near the tops of said projections, another zone of semiconductor material of said N-type conductivity on a part of said body opposite to said tops of said projections, and a group of zones of semiconductor material of P-type conductivity on parts of said body near the bottoms of said slots.

4. A semiconductor device comprising a body of semiconductor material of substantially intrinsic conductivity, a set of projections formed in said body and having slots therebetween, a group of zones of semiconductor material of P-type conductivity on respective parts of said body near the tops of said projections, another zone of semiconductor material of said P-type conductivity on a part of said body opposite to said tops of said projections, and a group of separate zones of semiconductor material of N-type conductivity on respective parts of said body near the bottoms of said slots.

5. Semiconductor apparatus comprising a body of semiconductor material of substantially intrinsic conductivity, a set of projections formed in said body and having slots therebetween, a group of zones of semiconductor material of one type of conductivity on respective parts of said body near the tops of said projections, another zone of semiconductor material of said one type of conductivity on a part of said body opposite to said tops of said projections and a group of zones of semiconductor material of opposite conductivity-type on respective parts of said body near the bottoms of said slots and means for connecting an external current flow path and a signal source between said first-mentioned group of zones and said zone on said part of the body opposite to said tops.

6. A semiconductor device comprising a body of semiconductor material of substantially intrinsic conductivity, a first set of projections formed in said body and having a first set of slots therebetween, a second set of projections formed in said body and having a second set of slots therebetween, a first group of zones of semiconductor material of one type of conductivity on respective parts of said body near the tops of said first set of projections, a second group of zones of semiconductor material of said one type of conductivity on parts of said body near the tops of said second set of projections, a third group of zones of said one type of conductivity on respective parts of said body near the bottoms of said first set of slots and a group of zones of semiconductor material of opposite conductivity-type on parts of said body near the bottoms of said second set of slots.

7. A semiconductor device comprising a body of semiconductor material of substantially intrinsic conductivity, a first set of projections formed in said body and having slots therebetween, a second set of projections formed in said body and having a second set of slots therebetween, said second set of projections being aligned with said first set of slots and said first set of projections being aligned with said second set of slots, a first group of zones of semiconductor material of one type of conductivity on respective parts of said body near the tops of said first set of projections, a second group of zones of semiconductor material of said one type of conductivity on respective parts of said body near the tops of said second set of projections, a third group of zones of semiconductor material of said one type on respective parts of said body near the bottoms of said first set of slots and a group of zones of semiconductor material of opposite conductivity type on respective parts of said body near the bottoms of said second set of slots.

8. A semiconductor device comprising a body of semiconductor material of substantially intrinsic conductivity, a first set of projections formed in said body and having slots therebetween, a second set of projections, formed in said body and having a second set of slots therebetween, said first and second sets of projections being aligned, and said first and second sets of slots being aligned, a first group of zones of semiconductor material of one type of conductivity on respective parts of said body near the tops of said first set of projections, a second group of zones of semiconductor material of said one type of conductivity on respective parts of said body near the tops of said second set of projections, a third group of zones of semiconductor material of said one type of conductivity on respective parts of said body near the bottoms of said first set of slots and a group of zones of semiconductor material of opposite conductivity-type on respective parts of said body near the bottoms of said second set of slots.

References Cited in the file of this patent

UNITED STATES PATENTS

| | | |
|---|---|---|
| 2,689,930 | Hall | Sept. 21, 1954 |
| 2,705,767 | Hall | Apr. 5, 1955 |